United States Patent
Yew et al.

(10) Patent No.: US 9,780,076 B2
(45) Date of Patent: Oct. 3, 2017

(54) PACKAGE-ON-PACKAGE STRUCTURE WITH THROUGH MOLDING VIA

(71) Applicant: Taiwan Semiconductor Manufacturing Company, Ltd., Hsin-Chu (TW)

(72) Inventors: Ming-Chih Yew, Hsin-Chu (TW); Fu-Jen Li, Hsin-Chu (TW); Po-Yao Lin, Zhudong Township (TW); Kuo-Chuan Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/356,268

(22) Filed: Nov. 18, 2016

(65) Prior Publication Data

US 2017/0069605 A1 Mar. 9, 2017

Related U.S. Application Data

(63) Continuation of application No. 14/990,547, filed on Jan. 7, 2016, now Pat. No. 9,502,387, which is a
(Continued)

(51) Int. Cl.
*H05K 1/11* (2006.01)
*H01L 25/065* (2006.01)
(Continued)

(52) U.S. Cl.
CPC ........ *H01L 25/0657* (2013.01); *H01L 21/486* (2013.01); *H01L 21/4853* (2013.01);
(Continued)

(58) Field of Classification Search
CPC .......... H05K 1/11; H05K 1/111; H05K 1/112; H05K 2201/10613; H05K 3/00; H05K 1/0271; H05K 2201/09063; H05K 2201/10378; H05K 2201/10734; H01L 21/56; H01L 21/561; H01L 21/565; H01L 23/3128; H01L 23/562; H01L 2224/16225; H01L 2224/48091; H01L 2924/15311; H01L 25/0657; H01L 21/4853; H01L 21/486; H01L 23/3157; H01L 23/49811; H01L 23/49838; H01L 2225/06513;
(Continued)

(56) References Cited

U.S. PATENT DOCUMENTS 6,403,896 B1 6/2002 Ma et al.
7,453,157 B2 11/2008 Haba et al.
(Continued)

FOREIGN PATENT DOCUMENTS

JP 2013147979 8/2013
KR 1020110107766 10/2011

*Primary Examiner* — Angel R Estrada
(74) *Attorney, Agent, or Firm* — Slater Matsil, LLP

(57) ABSTRACT

Disclosed herein is a device comprising a first package having a first side with a plurality of connectors disposed thereon and a second package mounted on the first package by the connectors. A molding compound is disposed on the first side of the first package and between the first package and the second package. A plurality of stress relief structures (SRSs) are disposed in the molding compound, the plurality of SRSs each comprising a cavity free of metal in the molding compound and spaced apart from each of the plurality of connectors.

20 Claims, 10 Drawing Sheets

Related U.S. Application Data continuation of application No. 14/025,414, filed on Sep. 12, 2013, now Pat. No. 9,237,647.

(51) Int. Cl.

| | | |
|---|---|---|
| *H01L 23/31* | (2006.01) | |
| *H01L 23/00* | (2006.01) | |
| *H05K 1/02* | (2006.01) | |
| *H01L 21/48* | (2006.01) | |
| *H01L 21/56* | (2006.01) | |
| *H01L 23/498* | (2006.01) | |

(52) U.S. Cl.
CPC ........ *H01L 21/565* (2013.01); *H01L 23/3128* (2013.01); *H01L 23/3157* (2013.01); *H01L 23/49811* (2013.01); *H01L 23/49827* (2013.01); *H01L 23/49838* (2013.01); *H01L 23/562* (2013.01); *H05K 1/0271* (2013.01); *H05K 1/11* (2013.01); *H01L 2224/16225* (2013.01); *H01L 2224/48091* (2013.01); *H01L 2224/48227* (2013.01); *H01L 2225/0651* (2013.01); *H01L 2225/06513* (2013.01); *H01L 2225/06517* (2013.01); *H01L 2225/06548* (2013.01); *H01L 2225/06555* (2013.01); *H01L 2924/15311* (2013.01); *H05K 2201/09063* (2013.01); *H05K 2201/10378* (2013.01); *H05K 2201/10613* (2013.01); *H05K 2201/10734* (2013.01)

(58) Field of Classification Search
CPC . H01L 2225/06517; H01L 2225/06548; H01L 2225/06555
USPC ........................ 174/261, 260, 256, 262, 254; 361/679.01, 748, 760, 783, 791, 805; 257/677, 684, 685, 686, 687; 438/126, 438/106
See application file for complete search history.

(56) References Cited

U.S. PATENT DOCUMENTS

| | | |
|---|---|---|
| 7,633,765 B1 | 12/2009 | Scanlan et al. |
| 7,660,130 B2 | 2/2010 | Fujii |
| 8,143,530 B1 | 3/2012 | Das et al. |
| 8,378,476 B2 | 2/2013 | Lee et al. |
| 8,847,369 B2 | 9/2014 | Yew et al. |
| 2011/0233747 A1 | 9/2011 | Lee et al. |

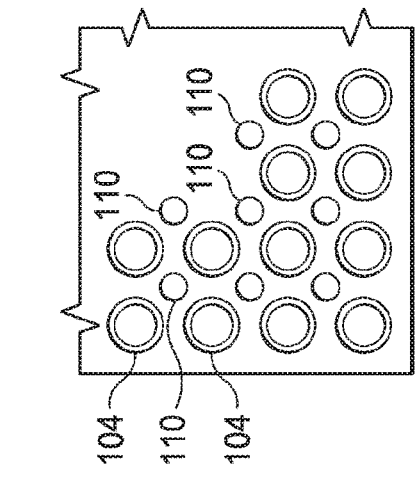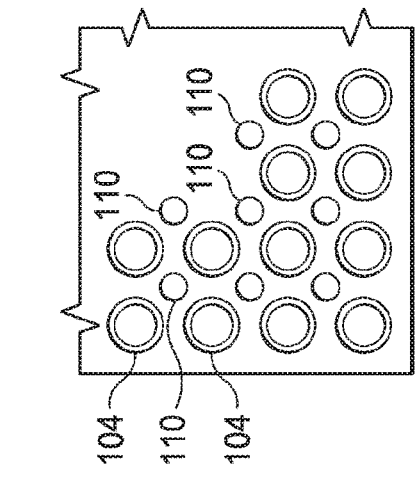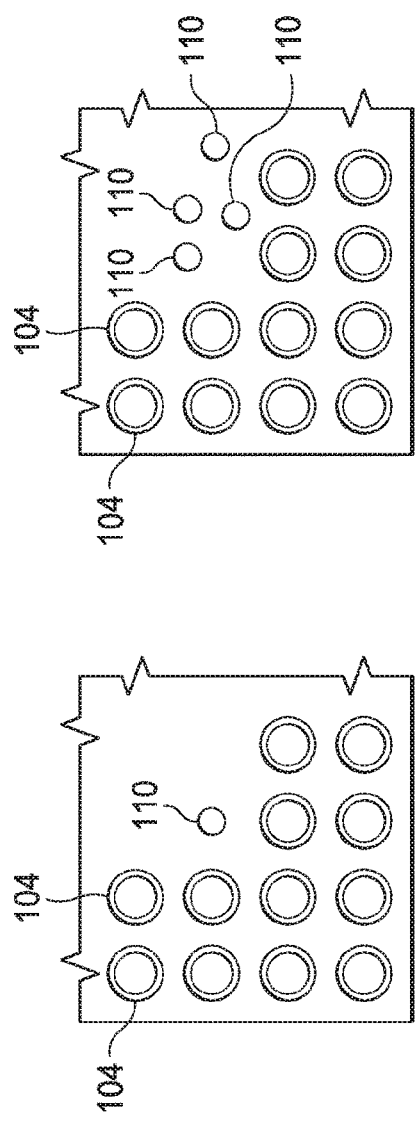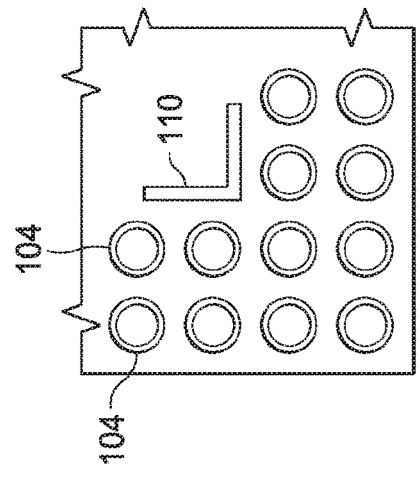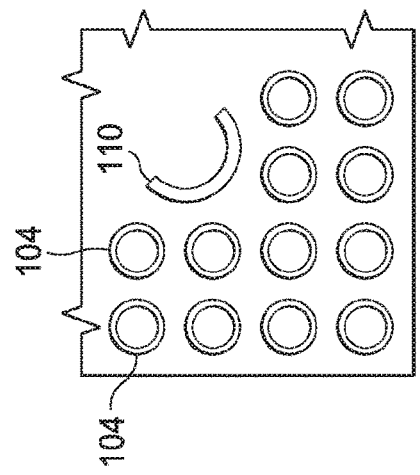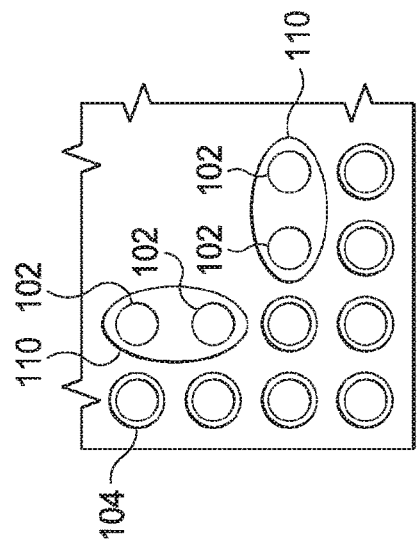

PACKAGE-ON-PACKAGE STRUCTURE WITH THROUGH MOLDING VIA

This application is a continuation of application Ser. No. 14/990,547, filed Jan. 7, 2016, entitled "Package-on-Package Structure with Through Molding Via," which is a continuation of application Ser. No. 14/025,414, filed on Sep. 12, 2013, entitled "Package-on-Package Structure with Through Molding Via," now U.S. Pat. No. 9,237,647, which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also, in some instances, require smaller packages that utilize less area than packages of the past.

Package on package (PoP) technology is becoming increasingly popular for its ability to allow denser integration of integrated circuits into a small overall package. PoP technology is employed in many advanced handheld devices, such as smart phones. While PoP technology has allowed for a lower package profile, the total thickness reduction is currently limited by the joint height and the distance between adjacent joints, referred to as the pitch. The PoP device is formed by stacking a package or substrate with one or more dies on a second package, and connecting the packages with conductive interconnects.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 11A-11F illustrate layouts of molded stress relief structures according to various embodiment.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable concepts that can be embodied in a wide variety of specific contexts. The specific embodiments discussed are merely illustrative of specific ways to make and use the disclosure, and do not limit the scope of the disclosure. Note that, for simplification, not all element numbers are included in each subsequent drawing. Rather, the element numbers most pertinent to the description of each drawing are included in each of the drawings.

Figure 1A:
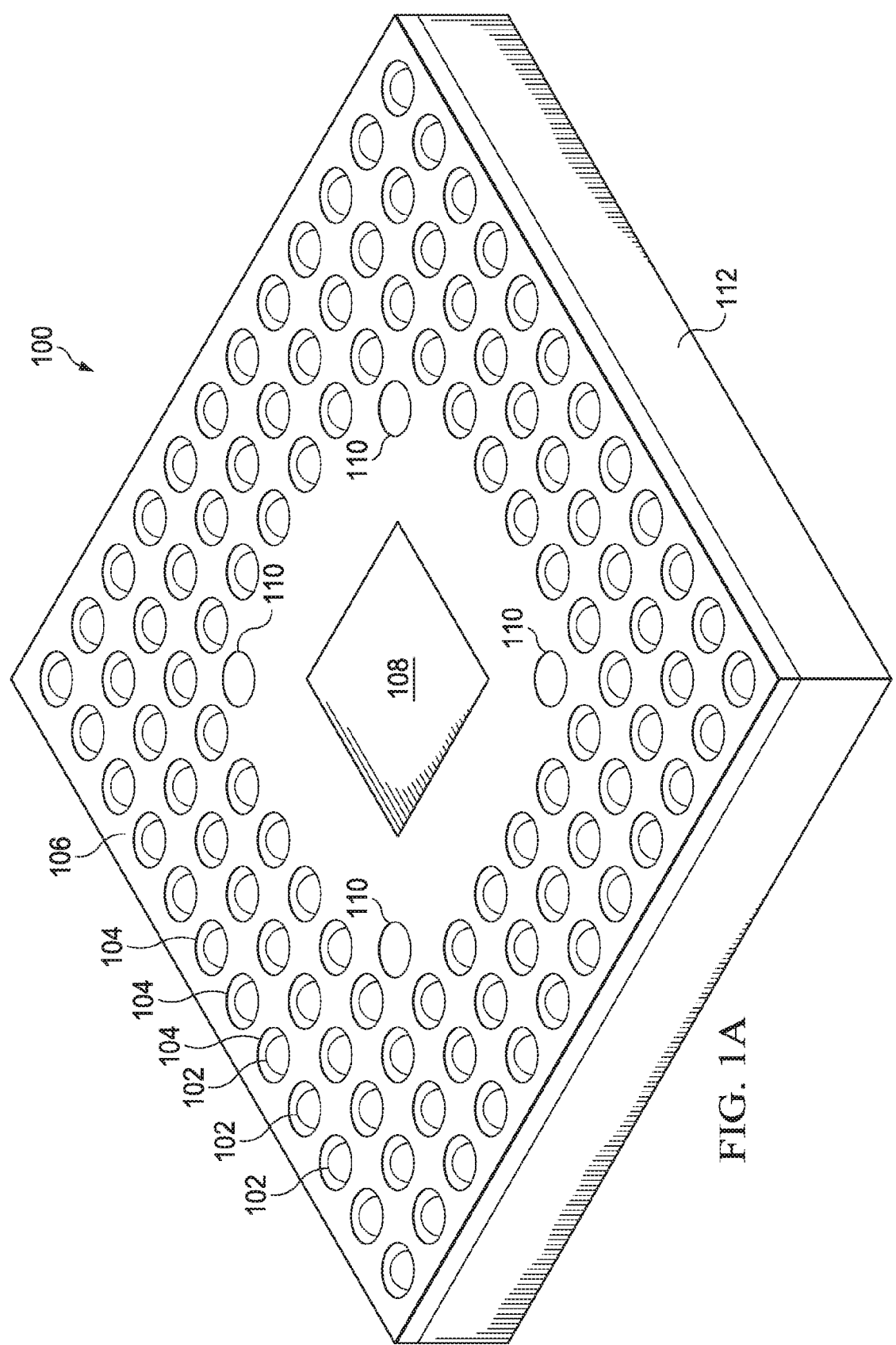
FIGS. 1A and 1B are diagrams illustrating packages with molded stress relief structures according to an embodiment.
Figure 1B:
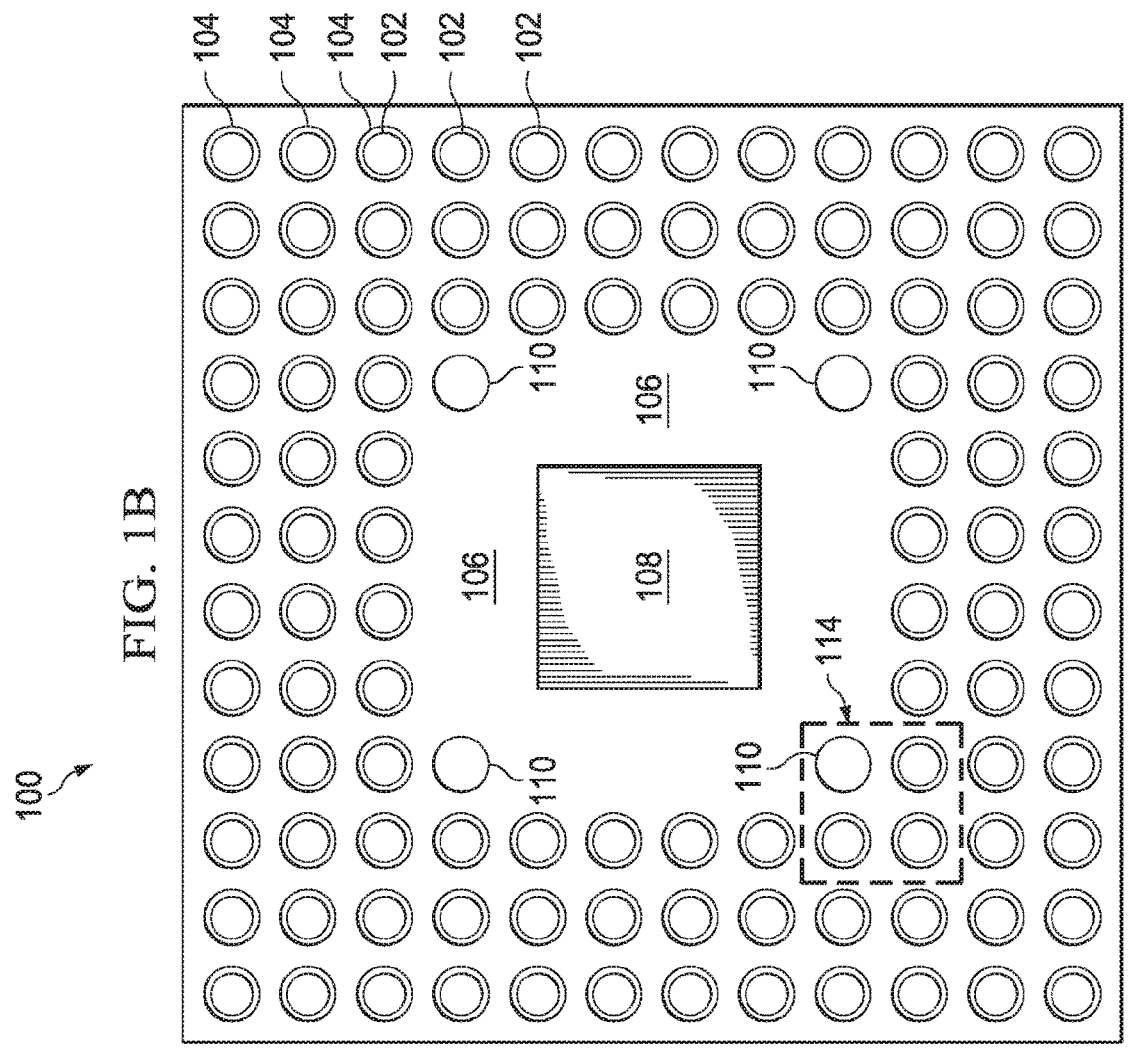

FIGS. 1A and 1B are a perspective view and a top view, respectively, of a package 100 having a molding compound 106 with stress relief structures (SRSs) 110 formed therein according to an embodiment of the disclosure. A package 100 has a substrate 112 with a molding compound 106 on one side. The molding compound 106 has connector openings 104 with a connector 102 disposed in each connector opening 104. A die 108 is mounted in the substrate 112 and embedded or otherwise disposed in the molding compound 106. In an embodiment, the die 108 is in the center region of the molding compound 106. The molding compound 106 also has one or more SRSs 110 near the interior corners of the array of connectors 102. The SRSs 110 are cavities within the molding compound 106.

The molding compound 106, substrate 112 and die 108 may each have a different coefficient of thermal expansion (CTE). Thermal processing of the package 100 after application of the molding compound 106 may cause the different elements to expand at different rates under the heating of the thermal processing, possibly causing the molding compound 106 to form cracks. The stresses causing cracking has been observed to be greatest at the interior corner region of the array of the connectors 102 identified as the stress region 114 in FIG. 1B. The thermal stress tends to cause cracking in the stress region 114, particularly between adjacent connector openings 104. Cracks in the molding compound 106 may extend from the top surface of the molding compound 106 to the substrate 112, exposing and possibly cracking traces on the surface of the substrate 112. Creating SRSs 110 near the stress region 114 relieves the stresses in the molding compound 106, reducing cracking of the molding compound 106.

Figure 2:
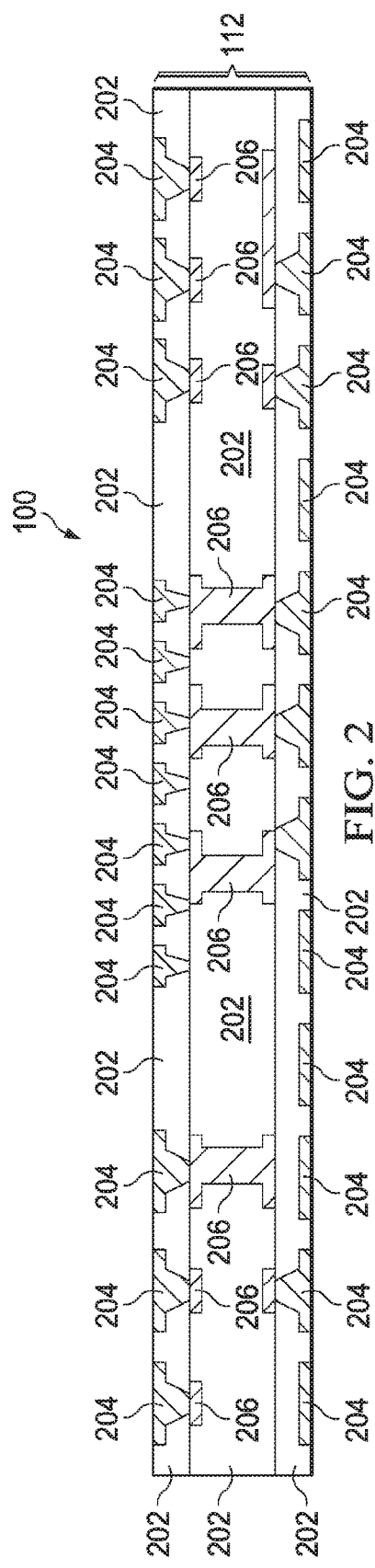
FIGS. 2 through 9 illustrate cross-sectional views of intermediate steps in forming a package-on-package structure with molded stress relief structures according to an embodiment.

FIG. 2 is a cross-sectional view illustrating a substrate 112 for a package 100 according to an embodiment. The substrate 112 may comprise one or more substrate layers 202 having one or more conductive elements 206 and one or more lands 204. While a single substrate 112 is shown in the drawings, several substrates 112 may optionally be processed on a workpiece (not shown) comprising a plurality of substrates 112 and the workpiece may be singulated during a subsequent process step.

The conductive elements 206 are metal vias, traces or other conductive features connecting the lands 204. In an embodiment, the substrate 112 includes one or more redistribution layers (RDLs) such as dielectric layers with one or more lands 204 which may be electrically connected by the conductive elements 206. In other embodiments, the substrate 112 is a PCB, carrier or other structure.

Figure 3:
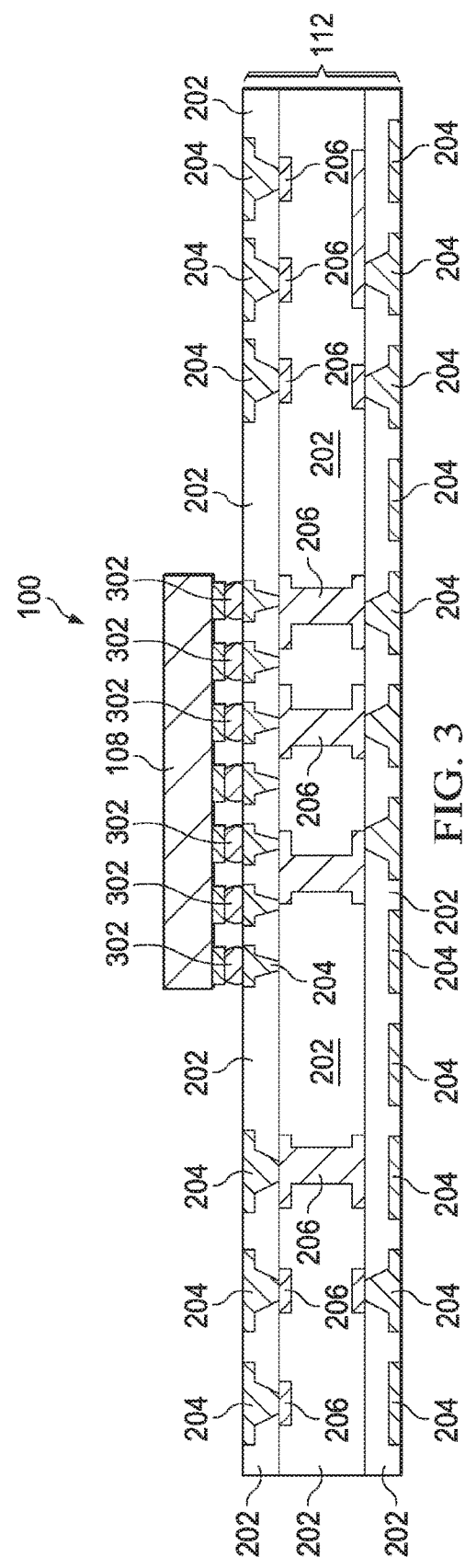

FIG. 3 is a cross sectional view illustrating mounting a die 108 on the substrate 112 according to an embodiment. One or more dies 108 may be mounted on the lands 204. While the mounting of a single die 108 is illustrated for clarity, any number of dies 108 may be mounted to the lands 204. The die 108, in some embodiments, is mounted to the lands 204 via solder balls 302 in a ball grid array, via surface mount technology, pin grid arrays, wire interconnects, conductive adhesive, a socket, or another suitable technique.

Figure 4:
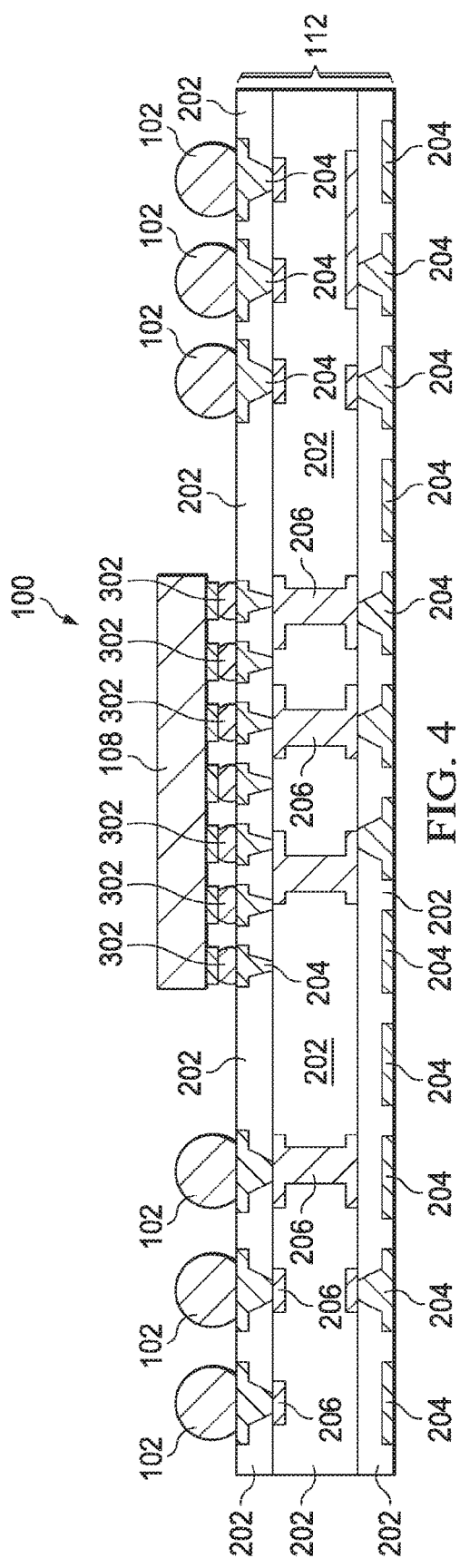

FIG. 4 is a cross-sectional view illustrating formation of connectors 102 on the top of the substrate 112 according to an embodiment. In such an embodiment, the connectors 102 are solder balls formed on the lands 204. In another embodiment, the connectors 102 are studs, pillars, bumps or other conductive features.

Figure 5:
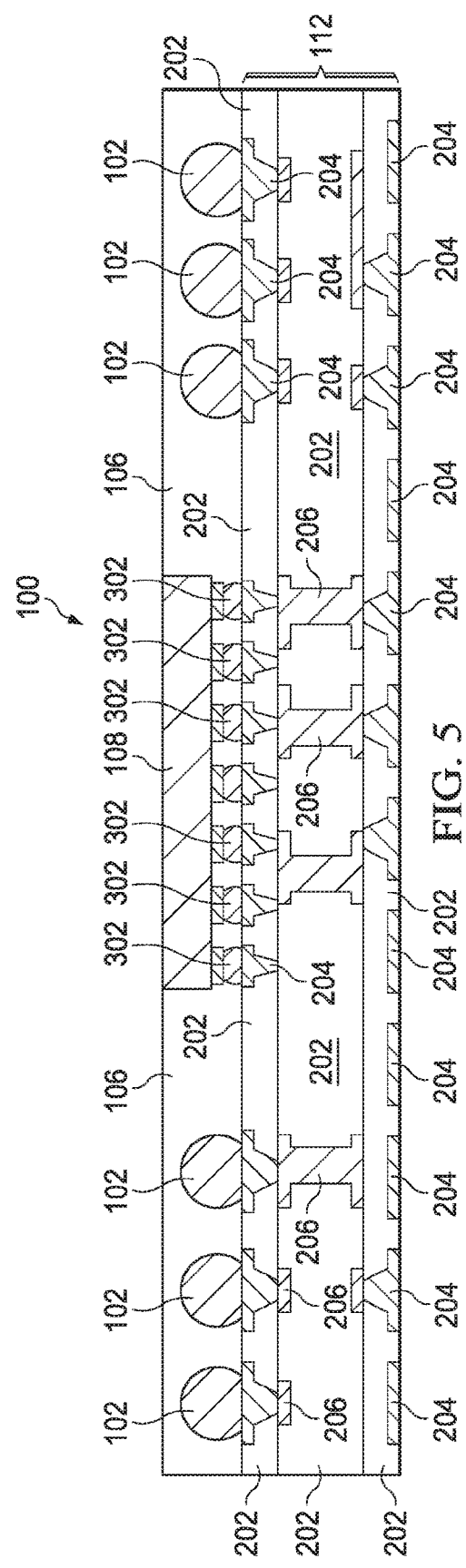

FIG. 5 is a cross sectional view of a molding compound 106 formed over the connectors 102. In an embodiment, the molding compound 106 is a nonconductive material such as an epoxy, a resin, a moldable polymer, or the like. In such an embodiment, the molding compound 106 is applied while substantially liquid, and then is cured through a chemical reaction, such as in an epoxy or resin. In other embodiments, the molding compound 106 is an ultraviolet (UV) or thermally cured polymer applied as a liquid, gel or malleable solid. In another embodiment, the molding compound 106 is a non-adhesive dry film layer.

In one embodiment, a mold is provided and the mold retains and shapes the molding compound 106 during application and curing. For example, a mold may have a border or other feature for retaining the molding compound 106 material when applied. The mold may comprise a release film to assist in parting the mold from the molding compound 106. For example, the release film is used in embodiments where the molding compound 106 is an epoxy or resin to prevent the molding compound 106 material from adhering to the mold surface.

In an embodiment, the molding compound 106 is formed covering the connectors 102 and the die 108 has a top surface exposed. In another embodiment, the die 108 is covered by the molding compound 106, and in another embodiment, the connectors 102 are exposed through the surface of the molding compound 106 after forming the molding compound.

Figure 6:
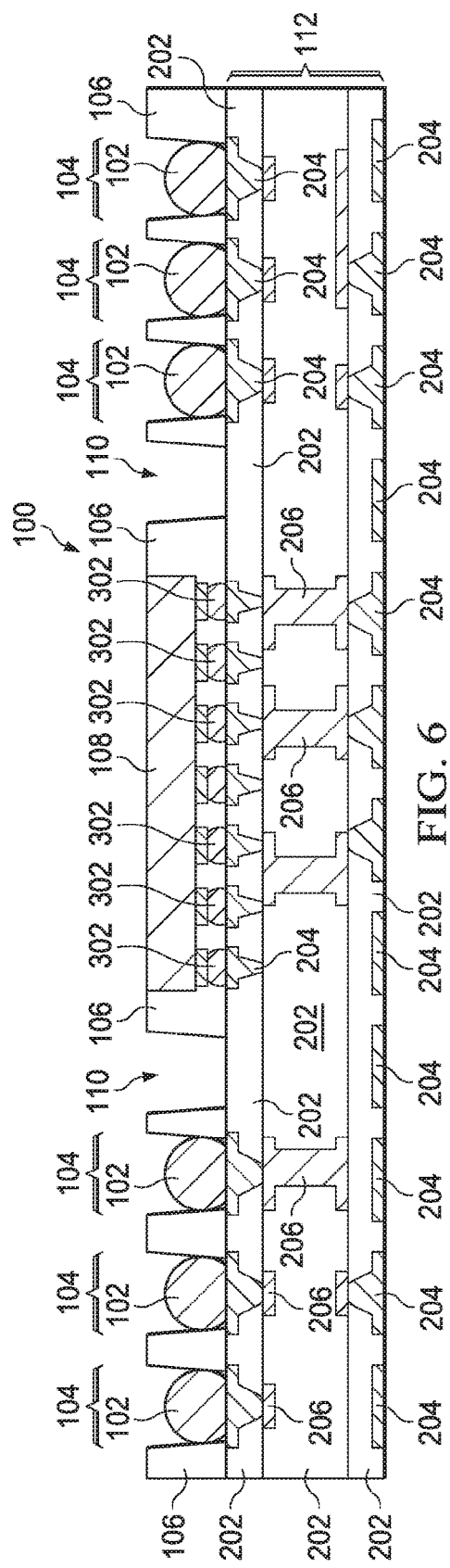

FIG. 6 is a cross-sectional view illustrating patterning of the molding compound 106 according to an embodiment. The molding compound 106 may have portions removed to form SRS 110 openings that, in an embodiment, are empty or free of metal features or connectors 102. Additionally, the molding compound 106 is removed over and around the connectors 102 to form the connector openings 104. In an embodiment, the SRSs 110 extend from the top surface of the molding compound 106 through the molding compound 106. In such an embodiment, the SRSs 110 each extend to the substrate 112. In another embodiment, the SRSs 110 extend partially through the molding compound 106, with a portion of the molding compound 106 forming the lowest or bottom surface of the SRS 110 so that part of the molding compound 106 is disposed between the SRS and the substrate 112.

In an embodiment, the molding compound 106 is removed by laser ablation to form the connector openings 104 and SRSs 110. In such an embodiment, a laser is used to form the connector openings 104 and the SRSs 110 by burning off or ablating the molding compound 106. The depth of the openings is controlled by the power of the laser, the speed at which the laser is moved or other processing factors. For example, a laser may have a cutting beam with a width smaller than the desired connector opening size, and may forming an opening by cutting a path in the molding compound. The laser is moved over the center portion of a connector 102 at a first, fast speed since the molding compound is thinner than other portions of the intended connector opening 104. The laser may be moved at a second, slower speed at the edges of the connectors 102, where the amount of molding compound removed is greater and where deeper cutting by the laser is required to achieve the desired depth.

In other embodiments, the molding compound 106 is patterned, for example, by etching the molding compound, by molding the molding compound 106 to shape while the molding compound 106 is in a liquid form, through milling or drilling or by another suitable process.

In an embodiment, the SRSs may be formed using the same process as the connector openings 104. Thus, the SRSs 110 may be formed using laser ablation. In another embodiment, the SRSs 110 are formed separately, either before or after the connector openings 104 are formed. In such an embodiment, the SRSs 110 may be formed using a different technique than the connector openings 104. For example, the connector openings 104 are formed during molding of the molding compound 106, and the SRSs 110 are subsequently formed with laser ablation.

In an embodiment, the connector openings 104 and SRSs 110 are round and formed with sloping sides, resulting in a conical shape. However, the connector openings 104 and SRSs 110 may each have a non-conical shape. For example, the connector openings 104 may be formed to conform to the shape of the connector 102. In such an example, square connectors may be disposed in a square or substantially square connector opening. In example, the SRSs 110 may be oblong, rectangular irregular or any other shape. Additionally, while a single SRS 110 is illustrated as being disposed near a group of connectors 102, in an embodiment, multiple SRSs 110 are used to effectively reduce strain in the molding compound 106.

Figure 7:
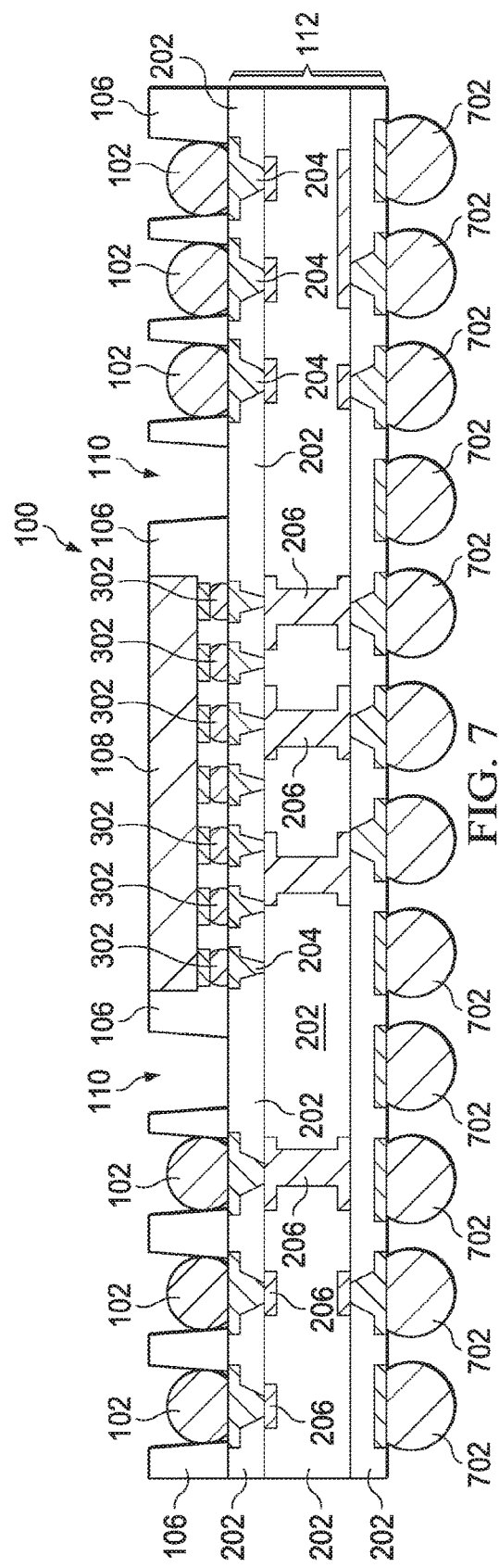

FIG. 7 is a cross-sectional view illustrating application of package connectors 702 to the substrate 112. One or more package connectors 702 are formed on the bottom side of the substrate 112 on the lands 204, resulting in a device configured to be mounted to another board, package, carrier, PCB or the like. In an embodiment, the package connectors 702 are solder balls. In other embodiments, the package connectors 702 are bumps, studs, pillars, land grid array (LGA) elements, pins or another conductive feature.

Figure 8:
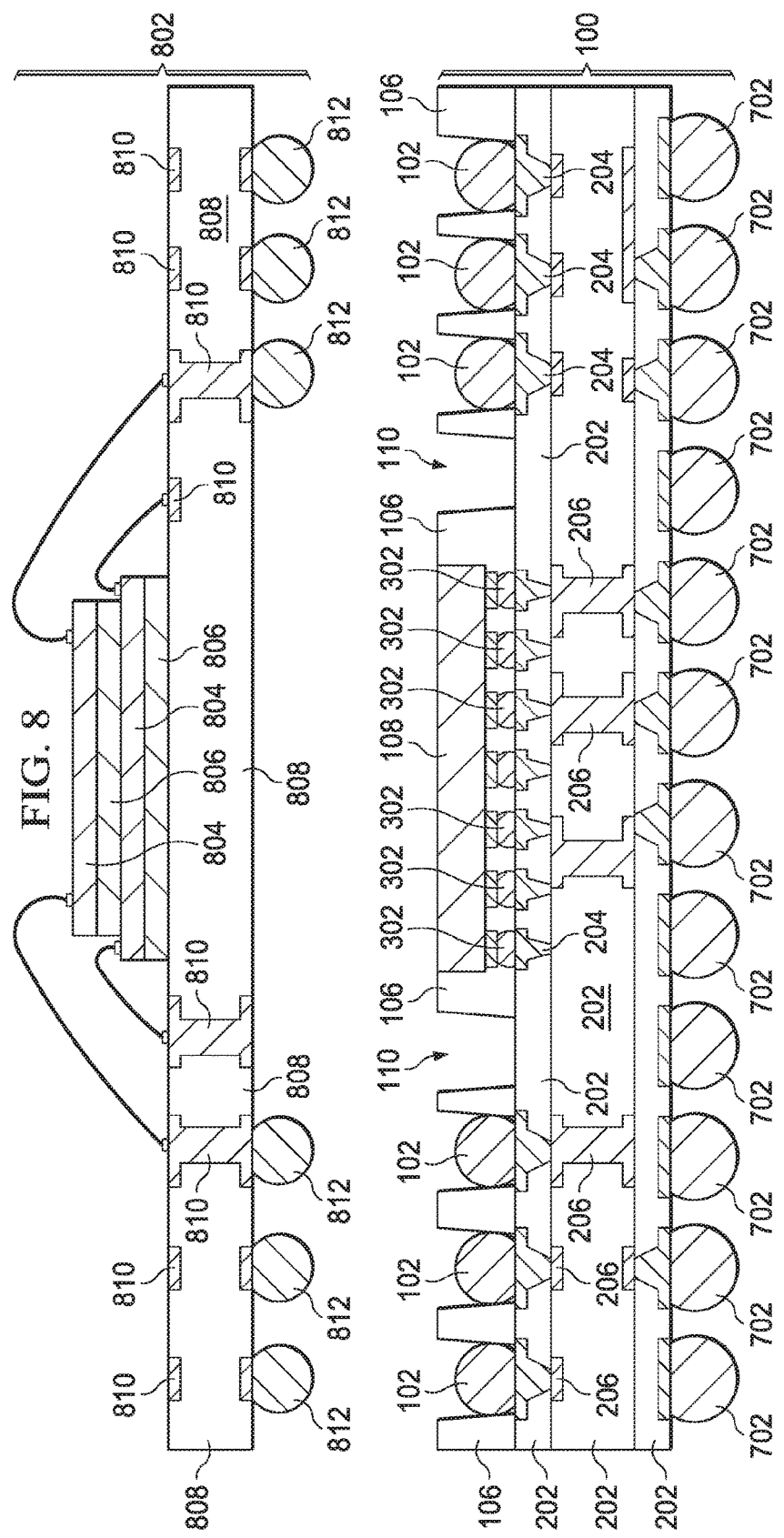
Figure 9:
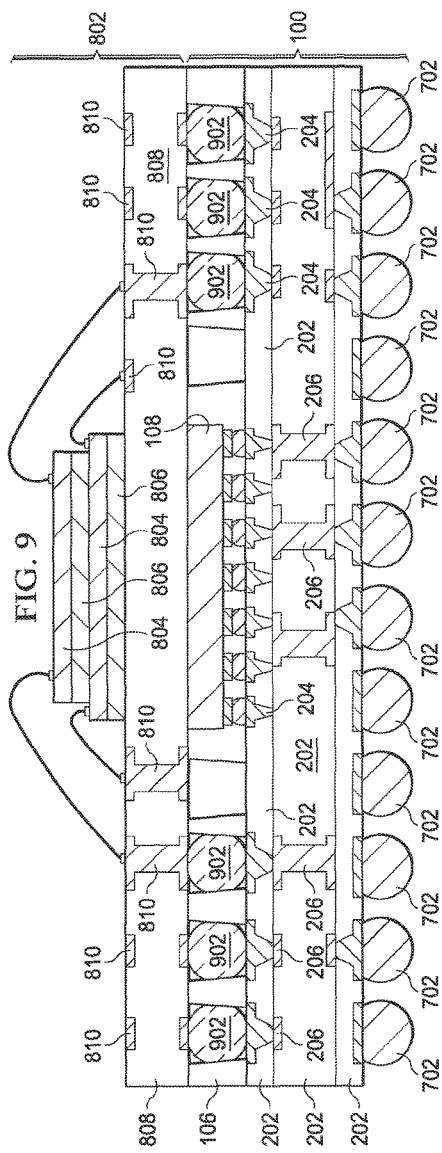

FIGS. 8 and 9 are cross sectional views illustrating application of a second package 802 to the package 100 according to an embodiment. The second package 802 has, for example, a substrate 808, such as an interposer, package substrate, another die, carrier or the like, with one or more dies 804 mounted thereon by way of a mount 806 such as an adhesive, underfill, solder ball grid or the like. One or more package mounts 812 are disposed along a bottom surface of the second package 802. In an embodiment, the substrate 802 has one or more conductive elements 810 disposed in an insulating layer 808 such as a dielectric, oxide, resin, PCB or other electrically insulating material. Conductive elements 810 are disposed in the insulating layer 808 and electrically connect the package mounts 812 to the dies 804.

The second package 802 is mounted on the package 100; with the connectors 102 contacting the package mounts 812. In an embodiment, the connectors 102 and package mounts 812 are solder balls, and the second package 802 is mounted to the package 100 by reflowing the solder balls to form a joint 902. In another embodiment, the package mounts 802 are studs, bumps, pillars or the like, and the second package 802 is joined to the package 100 by soldering the package connectors 812 to the package 100. In yet another embodiment the second package 802 is joined to the package 100 by a land grid array and lands, by pins and a socket, or by another conductive structure.

Figure 10:
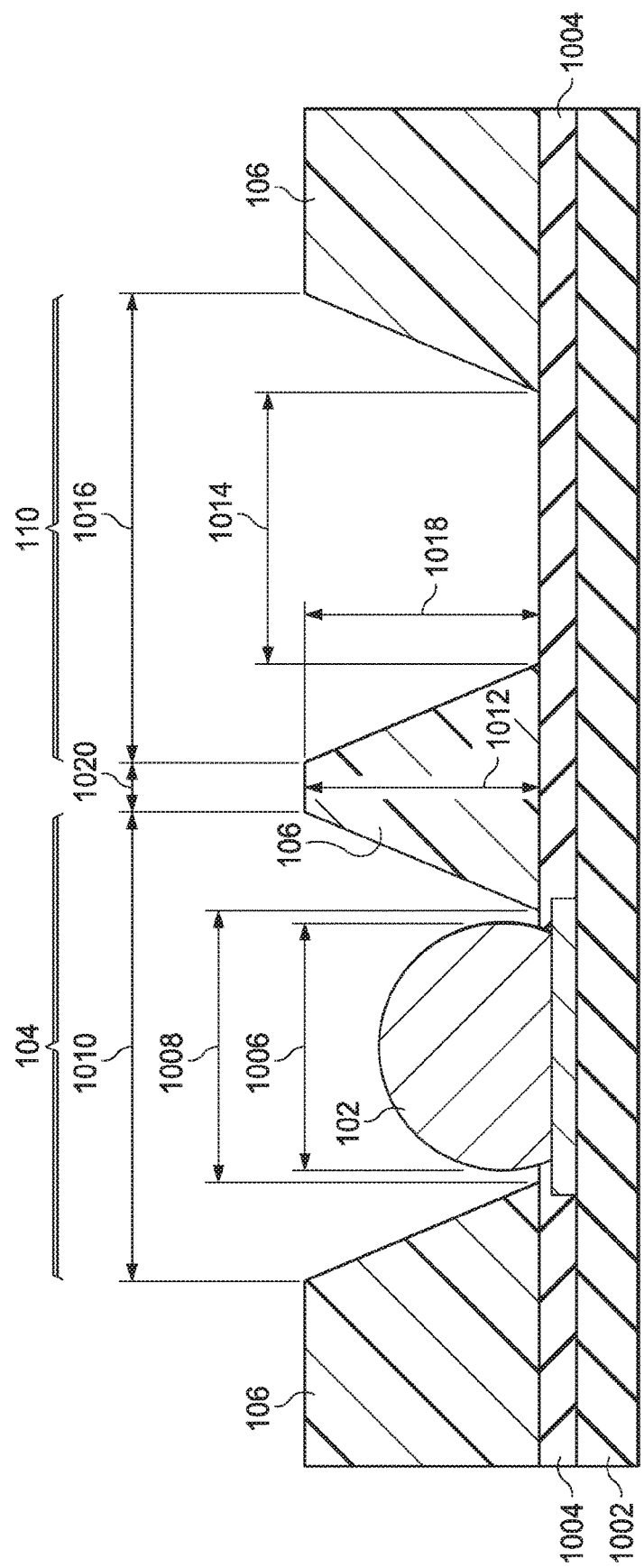
FIG. 10 is a cross-sectional diagram illustrating the structure of a molded stress relief structure according to an embodiment.

FIG. 10 is a cross-sectional diagram illustrating the structure of a SRS 110 according to an embodiment. In an embodiment, the molding compound 106 is on a finishing layer 1004 such as a polymer, oxide, nitride, or the like and has a thickness between about 120 μm and about 140 μm. The finishing layer 1004 is on a protection layer 1002 such as a passivation layer or the like.

The connector opening 104 has a bottom width 1008 that is about the same or greater than the width 1006 of the connector 102. In some embodiments, the SRS 110 is about the same size or same shape as the connector opening 104. In an embodiment, the connector width 1006 is about and about 170 μm and about 230 μm, the connector opening bottom width 1008 and SRS bottom width are between about 190 μm and about 250 μm, and the connector opening top width 1010 and SRS top width 1016 are between about 370 μm and about 430 μm.

The SRS 110 is spaced apart from the connector opening 104 so that any misalignment or error in the placement of the laser during molding compound 106 surface formation is accounted for. Additionally, spacing the SRS 110 apart from the connector opening 104 provides greater strength to the molding compound 106 around the connector opening 104. The size and spacing of the SRSs 110 is determined by the thickness of the molding compound 106, the pitch of the connector openings 104, the CTEs of the structures forming the package 100. In particular, the SRS 110 is spaced apart from the connector opening 104 by separation distance of at least 30 μm.

The molding compound 106 is provided on the substrate 112 in part to prevent warpage of the substrate 112. The total surface area of the SRSs 110 is between about 0.01% and about 15% of the surface area of the molding compound 106. In such an embodiment, the surface area of the SRSs 110 is determined by the area of the molding compound 106 omitted to form the SRSs 110. Additionally, the volume of each SRS 110 is between about $8 \times 10^{-6}$ mm$^3$ and about 5 mm$^3$. Limiting the volume and to total surface area of the SRSs 110 prevents weakening of the molding compound 106 and maintains the molding compound 106 support of the substrate.

FIGS. 11A, 11B and 11C illustrate top views of embodiments of SRS 110 arrangements in relation to the array of connectors 102. As shown in FIG. 11A, in an embodiment, a single SRS 110 is disposed in the connector 102 array interior corner region between the die 108 (See, e.g., FIGS. 1A-1B, 3-9) and the connectors 102, with the SRS 110 having a size or width smaller than the connector opening 104. In such an embodiment, the SRS 110 may have the same shape as the connector opening 104.

FIG. 11B shows an embodiment with multiple SRSs 110 disposed in the connector 102 array interior corner region between the die 108 (See, e.g., FIGS. 1A-1B, 3-9) and the connectors 102. The SRSs 110 are shown having a size or width smaller than the connector opening 104, though other sizes and shapes may be used. FIG. 11C shows an embodiment with one or more SRSs 110 disposed in the interior corner region of the array of connectors 102 and between the connectors 102.

FIGS. 11D, 11E and 11F illustrate top views various shaped of SRSs 110 according to embodiments. As shown in FIG. 11D, in an embodiment, an SRS 110 may have two or more connectors 102 disposed therein, with the walls of the SRS 110 separate from the connectors 102 and a gap or space in the molding compound 106 between two of the connectors 102. FIG. 11E shows an embodiment in which the SRS 110 is a partial ring disposed in the interior corner region of the array of connectors 102 between the die 108 (See, e.g., FIGS. 1A-1B, 3-9) and the connectors 102. FIG. 11F shows an embodiment of an SRS 110 with an angled shape disposed in the interior corner region of the array of connectors 102 between the die 108 (See, e.g., FIGS. 1A-1B, 3-9) and the connectors 102. It should be noted while embodiments of the SRSs 110 are shown here with a partial ring or an angled shape; the SRSs 110 can be shaped in to circle, oval, rectangle, ring, triangle, diamond, or other regular or irregular shape.

Figure 12:
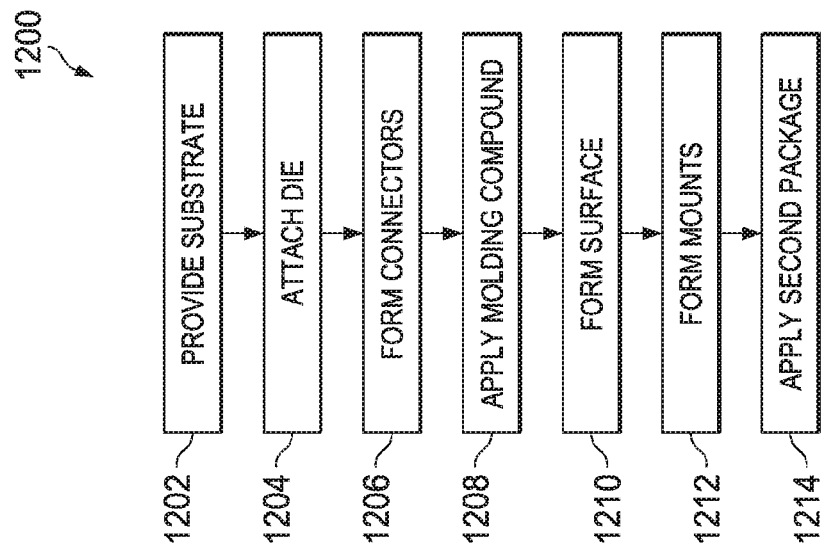
FIG. 12 is a flow diagram illustrating a method of forming a package-on-package structure with molded stress relief structures according to an embodiment.

FIG. 12 is a flow diagram illustrating a method 1200 of forming a package-on-package structure with SRSs according to an embodiment. A substrate is provided in block 1202 and one or more dies attached to the substrate in block 1204. Connectors are formed on the substrate in block 1206 and molding compound is applied in block 1208. The surface of the molding compound is formed in block 1210, exposing the connectors and forming one or more SRSs. One or more mounts are formed in block 1212 on the substrate opposite the die. A second package is applied in block 1214 to the package and over the molding compound.

Thus, a device according to an embodiment comprises a substrate having a first side with a plurality of connectors and a die disposed thereon and molding compound disposed on the first side and surrounding each of the plurality of connectors. A stress relief structure (SRS) is disposed in the molding compound, the SRS comprising a cavity in the molding compound separate from each of the plurality of connectors.

A device according to another embodiment comprises a first package having a first side with a plurality of connectors disposed thereon and a second package mounted on the first package by the connectors. A molding compound is disposed on the first side of the first package and between the first package and the second package. A plurality of stress relief structures (SRSs) are disposed in the molding compound, the plurality of SRSs each comprising a cavity free of metal in the molding compound and spaced apart from each of the plurality of connectors.

A method according to an embodiment comprises forming a molding compound on a first side of a first package and around each of a plurality of connectors on the first side of the first package, and forming a plurality of stress relief structures (SRSs) in the molding compound, the plurality of SRSs each comprising a cavity in the molding compound free of metal and spaced apart from each of the plurality of connectors.

In accordance with an embodiment, a device includes a die disposed on a substrate, a plurality of connectors disposed on the substrate and adjacent the die, and a molding compound disposed on the substrate. The molding compound surrounds each of the plurality of connectors and the die. The device further includes a plurality of openings in the molding compound, wherein each opening of the plurality of openings contains a respective one of the plurality of connectors. The device further includes a cavity in the molding compound. The cavity is substantially free of any features disposed therein, and the cavity has a same shape in a plan view as each opening of the plurality of openings.

In accordance with an embodiment, a device includes a first package having a first side with a plurality of connectors disposed thereon, a second package bonded to the first package by the plurality of connectors, and a molding compound disposed between the first side of the first package and the second package. The device further includes a first opening in the molding compound. At least two of the plurality of connectors are disposed in the first opening. The device also includes a second opening extending through the molding compound. The second opening is free of metal, and a portion of the molding compound is disposed between the second opening and the first opening.

In accordance with an embodiment, a method for forming a device includes providing a plurality of connectors on a surface of a substrate, forming a molding compound on the surface of the substrate and over the plurality of connector, and patterning the molding compound. Patterning the molding compound forms a first opening exposing at least one of the plurality of connectors and a second opening extending through the molding compound. The second opening is free of, and the second opening comprises rounded sidewalls in a top down view.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a device, comprising:
   forming a molding compound on a surface of a substrate; and
   patterning the molding compound to define:
   a first opening extending through the molding compound and exposing a conductive connector on the surface of the substrate; and
   a second opening extending through the molding compound, wherein the second opening is free of any conductive features disposed therein, wherein tops and bottoms of the first opening and the second opening are substantially level, and wherein the first opening and the second opening have substantially a same shape in a top-down view.

2. The method of claim 1, wherein a first area of the first opening in a plan view is less than a second area of the second opening.

3. The method of claim 1 further comprising:
   bonding a die to the surface of the substrate, wherein forming the molding compound comprises encapsulating the die in the molding compound; and
   after patterning the molding compound, bonding a package to the surface of the substrate, wherein the die and the molding compound are disposed between the substrate and the package.

4. The method of claim 3, wherein bonding the package to the surface of the substrate comprises disposing a first solder region of the package in the first opening, wherein the first solder region is electrically connected to the conductive connector.

5. The method of claim 3, wherein the first opening is disposed between the second opening and the die.

6. The method of claim 1, wherein the conductive connector comprises a second solder region disposed on a conductive land, wherein a sidewall of the second opening contacts a sidewall of the second solder region.

7. The method of claim 1, wherein patterning the second opening comprises a laser ablation process.

8. A method comprising:
   disposing a semiconductor die and a plurality of connectors on a surface of a substrate;
   dispensing a molding compound along sidewalls of the semiconductor die and the plurality of connectors; and
   patterning a first opening extending through the molding compound, wherein a continuous sidewall of the first opening completely encircles at least two of the plurality of connectors, and wherein no molding compound is disposed between any of the at least two of the plurality of connectors.

9. The method of claim 8, further comprising a second opening extending through the molding compound, wherein one of the plurality of connectors is disposed in the second opening, and wherein a portion of the molding compound is disposed between the first opening and the second opening.

10. The method of claim 9, wherein the first opening is disposed between the semiconductor die and the second opening.

11. The method of claim 9, wherein the second opening is smaller than the first opening in a top-down view.

12. The method of claim 8 further comprising bonding a package to the surface of the substrate, wherein bonding the package comprises bonding conductive features of the package directly to the plurality of connectors on the surface of the substrate.

13. The method of claim 8, wherein dispensing the molding compound comprises disposing a portion of the molding compound directly over the plurality of connectors, and wherein patterning the first opening comprises exposing the at least two of the plurality of connectors.

14. The method of claim 8, wherein patterning the molding compound further comprises exposing a top surface of the die, and wherein after patterning the molding compound, a top surface of the molding compound is higher than tops of the plurality of connectors.

15. A device package comprising:
   a semiconductor die on a surface of a substrate;
   a first conductive connector and a second conductive connector on the surface of the substrate;
   a molding compound disposed around the semiconductor die, the first conductive connector, and the second conductive connector;
   a first opening extending through the molding compound, wherein the first conductive connector is disposed in the first opening;
   a second opening extending through the molding compound, wherein the second conductive connector is disposed in the second opening; and
   a cavity extending through the molding compound, wherein no conductive connectors are disposed in the cavity, and wherein an entirety of the cavity is disposed between the first opening and the second opening in a top-down view of the device package.

16. The device package of claim 15 further comprising a package bonded to the surface of the substrate by the first conductive connector and the second conductive connector, wherein the semiconductor die is disposed between the substrate and the package.

17. The device package of claim 16, wherein the package comprises a package substrate having a through via extending through an additional substrate, and wherein the through via provides a conduction path from the first conductive connector to a surface of the package substrate opposite the semiconductor die.

18. The device package of claim 15, wherein bottoms of the cavity, the second opening, and the first opening are substantially level.

19. The device package of claim 15, wherein the cavity is smaller than the first opening and the second opening in the top-down view.

20. The device package of claim 15, wherein tops of the first opening, the second opening, and the cavity are substantially level with a top surface of the semiconductor die.

* * * * *